(12) United States Patent
Isozumi et al.

(10) Patent No.: US 11,658,081 B2
(45) Date of Patent: May 23, 2023

(54) SEMICONDUCTOR APPARATUS AND SEMICONDUCTOR DEVICE

(71) Applicant: RENESAS ELECTRONICS CORPORATION, Tokyo (JP)

(72) Inventors: Yoichi Isozumi, Tokyo (JP); Takafumi Betsui, Tokyo (JP); Shuuichi Kariyazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 11 days.

(21) Appl. No.: 17/326,829

(22) Filed: May 21, 2021

(65) Prior Publication Data

US 2022/0375804 A1 Nov. 24, 2022

(51) Int. Cl.
| | |
|---|---|
| *H01L 21/66* | (2006.01) |
| *H01L 25/065* | (2023.01) |
| *H01L 23/538* | (2006.01) |
| *H01L 23/64* | (2006.01) |

(52) U.S. Cl.
CPC .......... *H01L 22/32* (2013.01); *H01L 23/5383* (2013.01); *H01L 23/5386* (2013.01); *H01L 23/647* (2013.01); *H01L 25/0655* (2013.01)

(58) Field of Classification Search
CPC ....... G01R 31/316–31937; G01R 31/28–2898; H01L 22/30–34; H01L 25/0655; H01L 23/538–5389
See application file for complete search history.

(56) References Cited

U.S. PATENT DOCUMENTS

2018/0226331 A1* 8/2018 Sarkar ................... H01L 22/32
2018/0254252 A1* 9/2018 Nakagawa ............ H01L 23/642

FOREIGN PATENT DOCUMENTS

JP 2006-245393 A 9/2006

* cited by examiner

*Primary Examiner* — Selim U Ahmed
*Assistant Examiner* — Evan G Clinton
(74) *Attorney, Agent, or Firm* — McDermott Will & Emery LLP (57) ABSTRACT

A semiconductor apparatus includes a mounting board, a system on chip (SOC) package and a memory package which are provided on the mounting board. The SOC package includes a semiconductor chip and a package substrate on which the semiconductor chip is mounted. The semiconductor apparatus further includes a signal wiring line through which a signal between the semiconductor chip and the memory package is transmitted, being provided on the package substrate and in the mounting board and a measurement terminal connected to the signal wiring line on main surface of the package substrate.

10 Claims, 8 Drawing Sheets

SEMICONDUCTOR APPARATUS AND SEMICONDUCTOR DEVICE

BACKGROUND

The present disclosure relates to semiconductor apparatus and is particularly useful for semiconductor apparatus having semiconductor device with high-speed interfaces.

A semiconductor system constituting a ADAS system (Advanced Driver-Assistance Systems) or the like in recent years includes a semiconductor device such as an SOC (System on Chip) having a high-speed data processing device, and a memory device having a high-speed interface (IF), for example, a DRAM (Dynamic Random-Access Memory. For DRAM, Low Power DDR-SDRAM 4 (Double Data Rate Synchronous DRAM: LPDDR4) with Max Transfer Rate 4266 Mbps or Low Power DDR-SDRAM 5 (LPDDR5) with Max Transfer Rate 6400 Mbps, etc. can be used. The signals interfaced between SOC and DRAM are required to be faster. The semiconductor system is required to be smaller in size and cost reduction. Furthermore, there is an increasing demand for shorter Time to Market (i.e. Time to bring semiconductor systems to market as products).

In such market trends, Japanese Unexamined Patent Application Publication No. 2006-245393 discloses a method of placing a measurement terminal on a mounting board to guarantee for long-term reliability of a semiconductor apparatus in which a plurality of semiconductor devices having a high-speed interface are mounted on a mounting board.

SUMMARY

The objective of Japanese Unexamined Patent Application Publication No. 2006-245393 is device control using a test terminal and is not a measure of signal-quality during high-speed operation. Therefore, semiconductor apparatus of Japanese Unexamined Patent Application Publication No. 2006-245393 discloses a structure that cancels the reflection from the device terminal and the test terminal (stub structure) during high-speed operation. In order to realize this structure, it is necessary to consider design constraints, terminal arrangement, impedance control, wiring length adjustment, etc. In order to further increase the speed of the signal and small amplitude of the signal, the design constraints are greater. In addition, because the reflection effect on the original signal is considered and it is difficult to improve the signal quality, there is a problem that the versatility is low for signal measurement.

Figure 1:
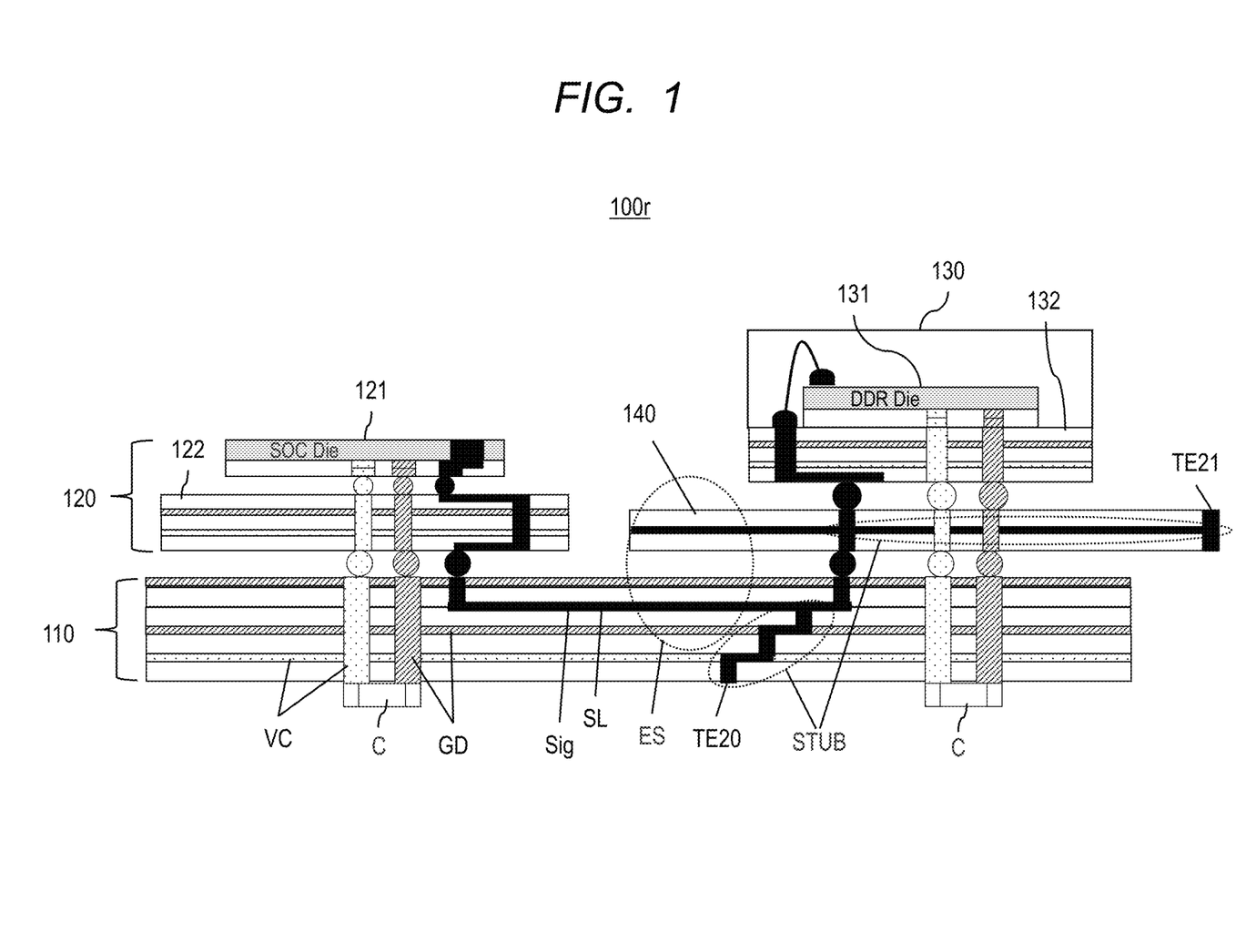
FIG. 1 is a diagram illustrating a conceptual configuration example of a semiconductor apparatus when an interposer with a measurement terminal according to a comparative example is used.

On the other hand, utilizing an interposer with a measurement terminal for the purpose of measuring the signal quality is also widely known. FIG. 1 is a diagram illustrating a conceptual configuration example of a semiconductor apparatus when an interposer with a measurement terminal according to a comparative example is used. As shown in FIG. 1, a semiconductor apparatus 100r includes a mounting board 110, an SOC package 120, a DRAM package 130, and an interposer 140. The SOC package 120 and the interposer 140 are mounted on the mounting board 110, and DRAM package 130 is mounted on the interposer 140. The SOC package 120 includes a semiconductor chip (SOC Die) 121 of semiconductor device including a high-speed data processing device, and a package substrate 122 on which the semiconductor chip 121 is mounted. The DRAM package 130 includes a semiconductor chip (DDR Die) 131 as DDR-SDRAM and a package substrate 132 on which the semiconductor chip 131 is mounted. In FIG. 1, the wiring VC shows the power supply potential wiring and the power supply potential layer or the like the power supply potential VCC is supplied, the wiring GD shows the ground potential wiring and the ground potential layer ground potential GND is supplied. Further, between the wiring VC and the wiring GD, the capacitor C for power supply stabilization is connected. The wiring VC and the wiring GD are electrically separated.

Here, the high-speed signal Sig between the semiconductor chip 121 and the semiconductor chip 131 is transmitted through the signal line SL. The high-speed signal Sig is measured via the measurement terminal TE20 provided on the mounting board 110, and via the measurement terminal TE21 provided on the interposer 140. As described in FIG. 1, when placing the measurement terminal TE20 on the mounting board 110, or sandwiching the interposer 140 with the measurement terminal TE21 between the mounting board 110 and DRAM packaging 130, it has the following three problems.

1) Signal-Quality (Quality)

By providing the measurement terminals TE20 and TE21, an extra stub structure (STUB) is formed on the signal transmission path (SL). Therefore, the signal waveform of the high-speed signal Sig is deteriorated. As a result, the signal waveform may not be correctly evaluated, and the semiconductor system 100r itself may not operate.

2) Packaging Area and Costs (Cost)

The area (ES) for providing the measurement terminals TE20, TE21 needs to be allocated on the mounting board 110 and the interposer 140. As a result, the resources and the area of the mounting board 110, which is a system board, increase. This is a disadvantage in terms of packaging area and cost, as the market tends to be smaller and lower in cost.

3) Developmental Period (Delivery)

The interposer 140 needs to be mounted on the mounting board 110 by each system manufacturer of the semiconductor system 100r. Thus, the development period of the semiconductor system may be prolonged.

An object of the present disclosure is to provide a technique that allows measurement terminals to be provided on semiconductor apparatus without compromising the signal quality of the high-speed signal.

Other objects and novel features will become apparent from the description of this specification and the accompanying drawings.

An outline of representative ones of the present disclosure will be briefly described below.

According to one embodiment, a semiconductor apparatus includes a mounting board, a system on chip (SOC) package formed on the mounting board and including a semiconductor chip and a package substrate on which the semiconductor chip is mounted, a memory package formed on the mounting board, a signal wiring line through which a signal between the semiconductor chip and the memory package is transmitted, being provided on the package substrate and in the mounting board and a measurement terminal connected to the signal wiring line on main surface of the package substrate.

According to another embodiment, a semiconductor device includes a semiconductor chip, a package substrate on which the semiconductor chip is mounted, including a signal wiring line supplied with a signal for the semiconductor chip, and a measurement terminal provided on a main surface of the package substrate and connected to the signal wiring line.

According to semiconductor apparatus of embodiments, the high-speed signal can be measured without deteriorating the signal quality of the high-speed signal by using the measurement terminal.

DETAILED DESCRIPTION

Hereinafter, Embodiment will be described with reference to the drawings. However, in the following description, the same components are denoted by the same reference numerals, and a repetitive description thereof may be omitted. It should be noted that the drawings may be represented schematically in comparison with actual embodiments for the sake of clarity of explanation but are merely an example and do not limit the interpretation of the present invention.

Embodiment 1

Figure 2:
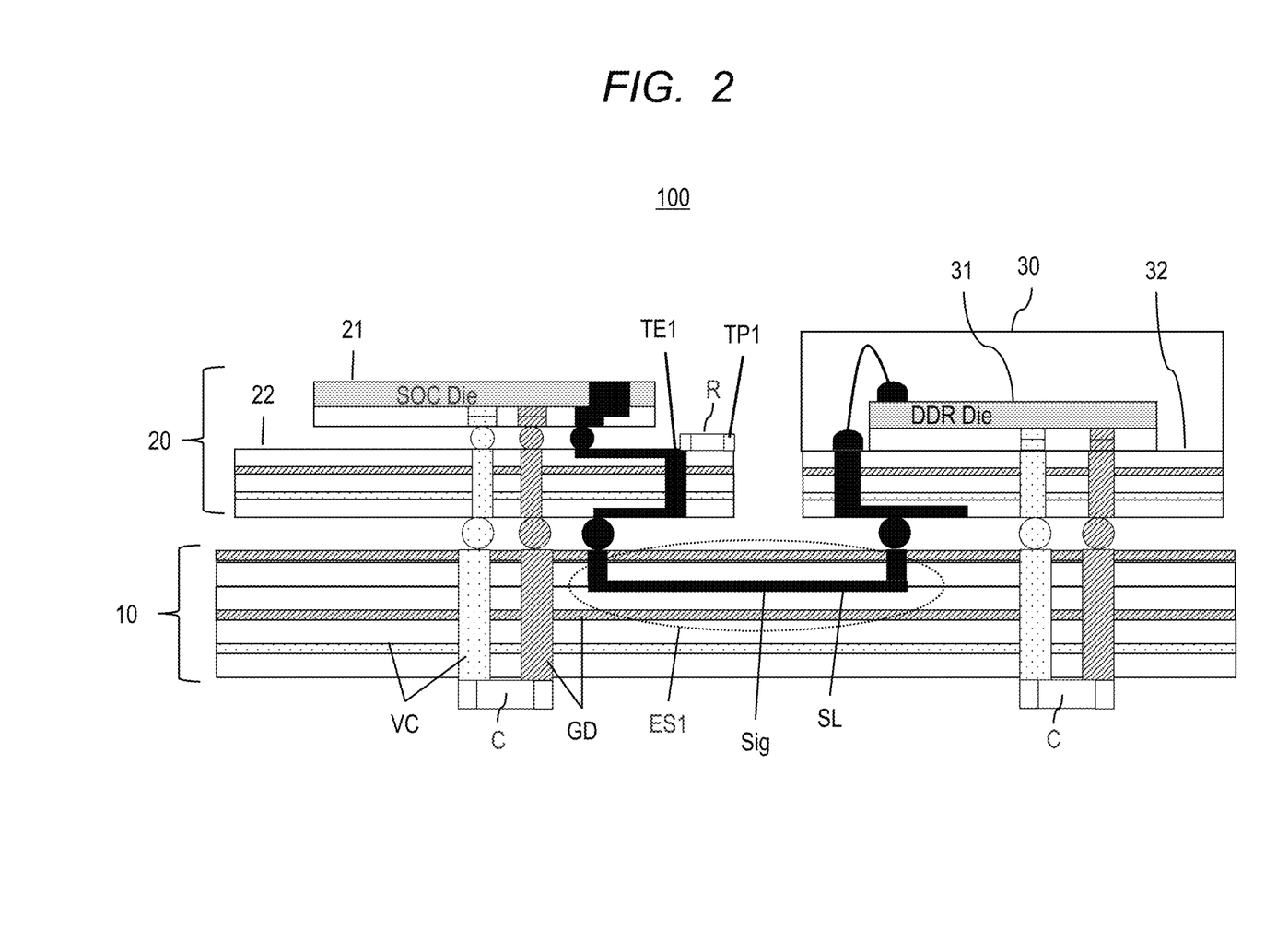
FIG. 2 is a diagram illustrating a conceptual configuration of semiconductor apparatus according to embodiments.

FIG. 2 is a diagram illustrating a conceptual configuration of a semiconductor apparatus according to Embodiment 1. As shown in FIG. 2, semiconductor apparatus 100 includes a mounting board 10, an SOC package 20, and a DRAM package 30. The SOC package 20 and DRAM package 30 are mounted on the main surface of the mounting board 10. The SOC package 20 includes a semiconductor chip (SOC Die) 21 of a semiconductor device containing a high-speed data-processing device, and a package substrate 22 on which the semiconductor chip 21 is mounted on its main surface. The DRAM package 30 includes a DDR-SDRAM memory semiconductor chip (DDR Die) 31 and a package substrate 32 on which the memory semiconductor chip 31 is mounted. The DRAM package 30 can also be referred to as memory package.

In FIG. 2, the wiring VC shows the power supply potential wiring and the power supply potential layer or the like power supply potential VCC is supplied, the wiring GD shows the ground potential wiring and the ground potential layer ground potential GND is supplied. Further, between the wiring VC and the wiring GD, the capacitor C for power supply stabilization is connected. The wiring VC and the wiring GD are electrically separated.

A measurement terminal TE1 is provided on the main surface of the package substrate 22. The measurement terminal TE1 is connected to one terminal of the resistor R. The other terminal of the resistor R is used as a probe terminal TP1 connected to the probe of the measuring apparatus. Here, the high-speed signal Sig transmitted via the signal line (signal wiring) SL, which is drawn in black between the semiconductor chip 21 and the memory semiconductor chip 31, is measured by utilizing a probe terminal TP1 connected to the measurement terminal TE1 via a resistor R provided on the package substrate 22 of the SOC package 20.

Figure 3:
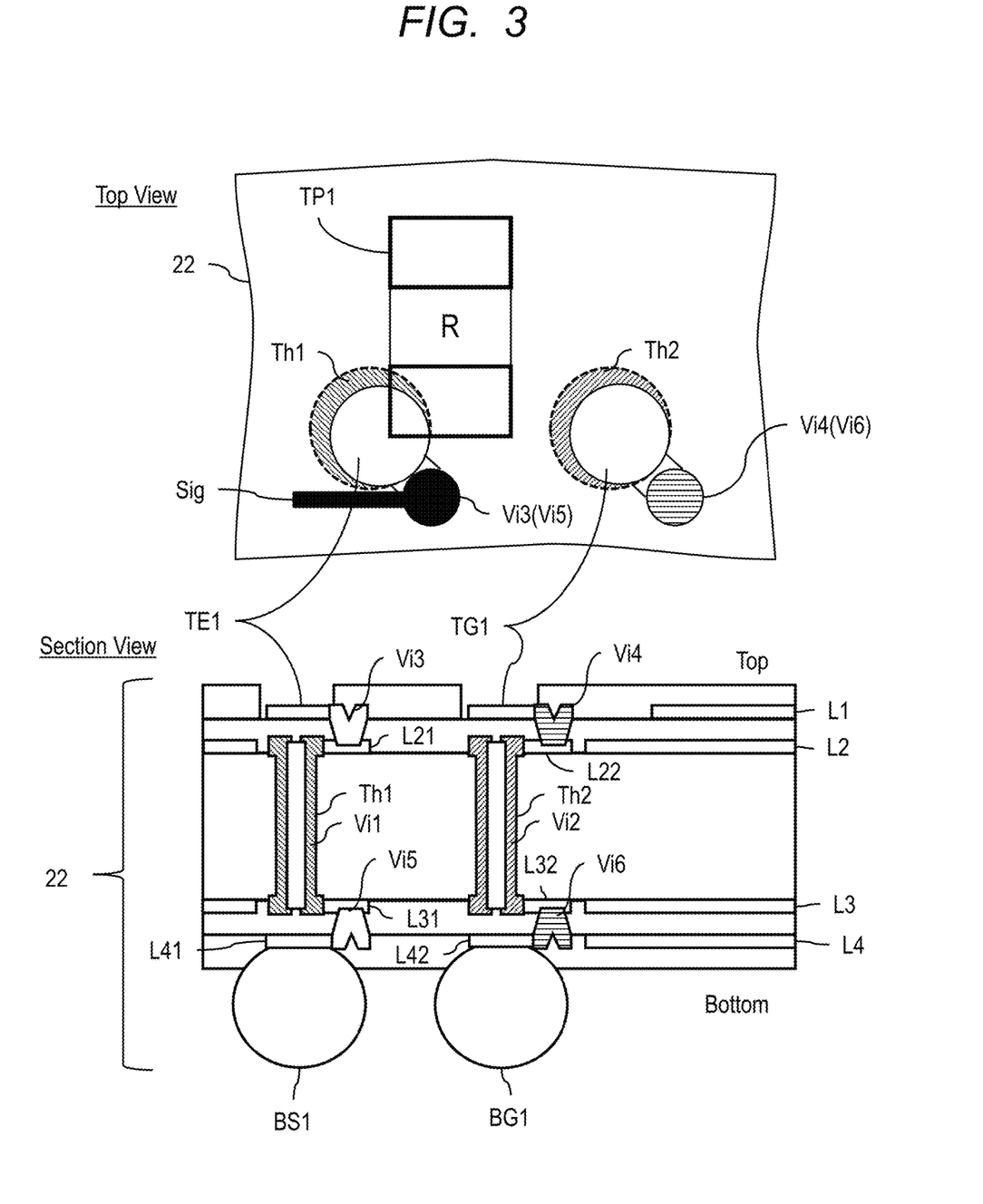
FIG. 3 is a diagram showing a configuration example of an area of the package substrate for measurement terminals are provided.
Figure 4:
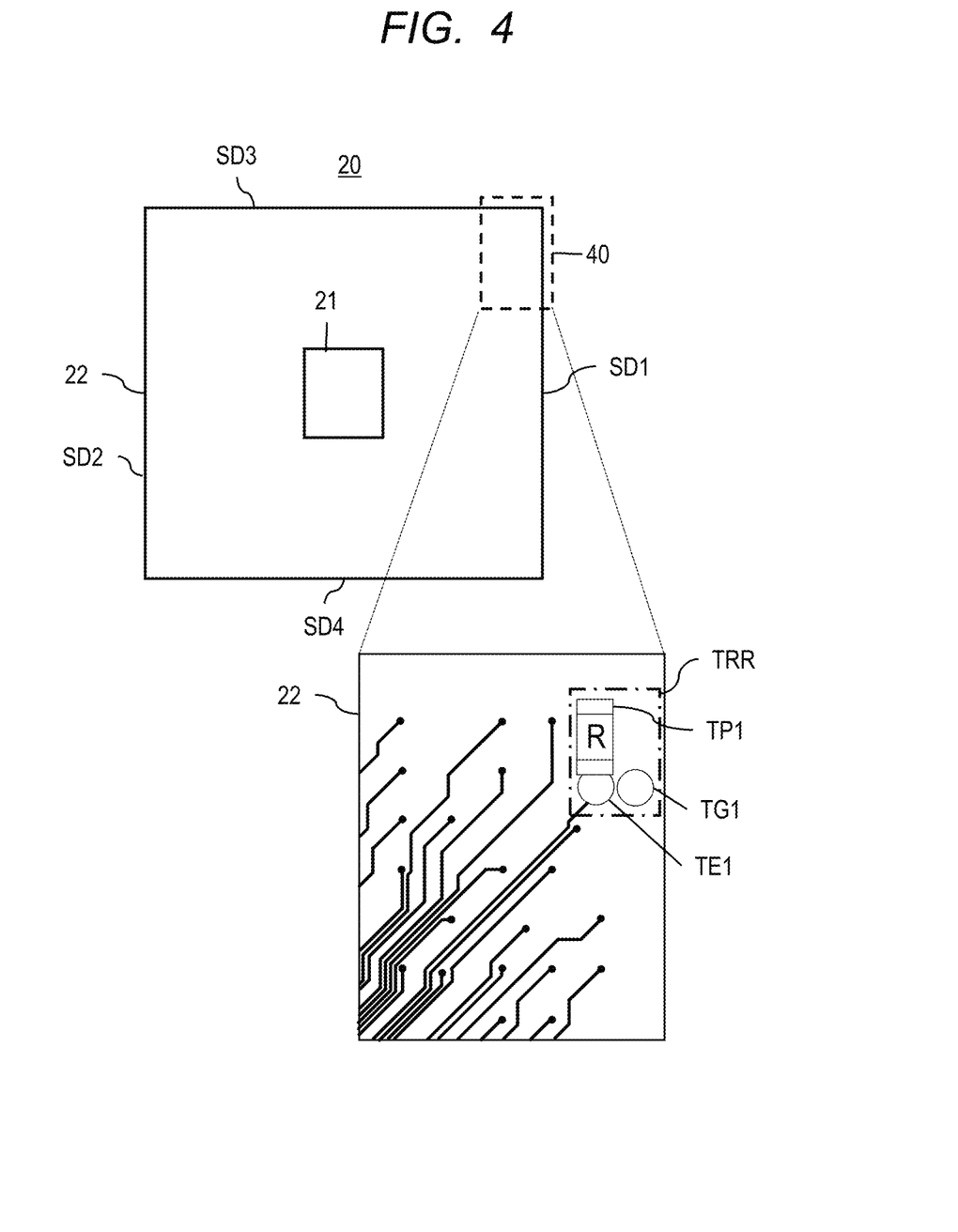
FIG. 4 is a plan view illustrating an exemplary configuration of the SOC package.
Figure 5:
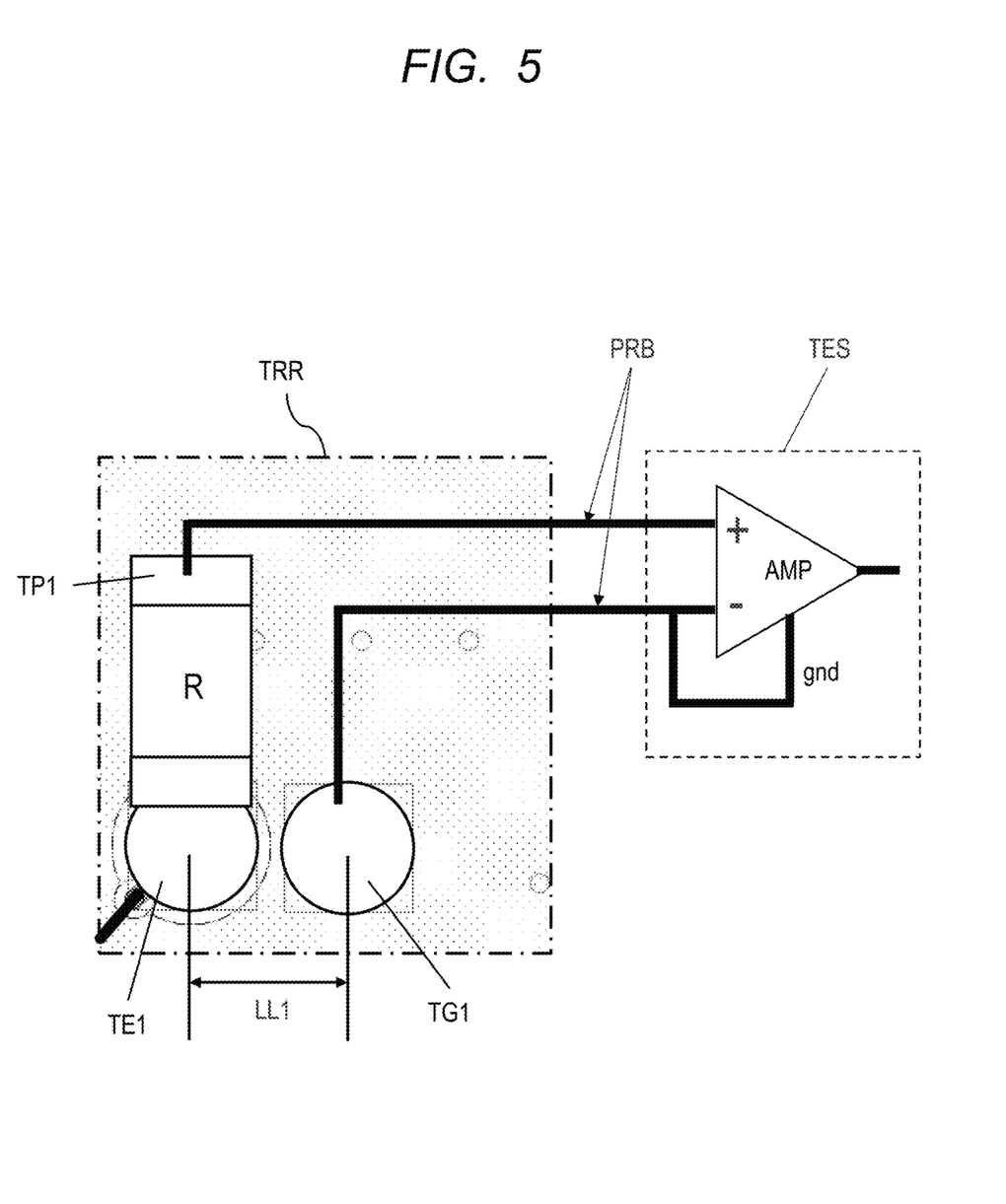
FIG. 5 is a diagram for explaining the connection to the probes of the measuring apparatus.

FIG. 3 is a diagram illustrating an exemplary configuration of an area of a package substrate 22 in which measurement terminal TE1 is provided. FIG. 4 is a plan view illustrating an exemplary configuration of the SOC package 20. FIG. 5 is a diagram for explaining the connection to the probes of the measuring apparatus.

As shown in FIG. 3, the package substrate 22 of the SOC package 20 includes resin substrates of a multilayer wiring having a plurality of wiring layers L1-L4. The wiring layers includes, from the upper layer, a first wiring layer L1 as a top (TOP) layer, a second wiring layer L2, a third wiring layer L3, and a fourth wiring layer L4. The Insulating resin layers are formed, on the first wiring layer L1, between the first wiring layer L1 and the second wiring layer L2, between the second wiring layer L2 and the third wiring layer L3, between the third wiring layer L3 and the fourth wiring layer L4, and under the fourth wiring layer L4. The through-holes Th1 and Th2 are formed so as to electrically connect between the wiring of the second wiring layer L2 and the wiring of the third wiring layer L3. On the inner surface of the through-holes Th1 and Th2, the conductive portion Vi1 and Vi2 subjected to conductive plating is provided. The via electrodes Vi3 and Vi4 are formed so as to electrically connect between the wiring of the first wiring layer L1 and the wiring of the second wiring layer L2. Further, so as to electrically connect between the wiring of the third wiring layer L3 and the wiring of the fourth wiring layer L4, the via electrodes Vi5 and Vi6 are provided.

As shown by cross-sectional view (Section View) in FIG. 3, in the top side of the package substrate 22, the measurement terminal TE1 formed in the first wiring layer L1 is provided The measurement terminal TE1 is electrically connected to the BGA terminal BS1 for a signal Sig provided on the bottom side of the package substrate 22 through the via electrode Vi3, the wiring L21 of the second wiring layer L2, the through-hole Th1, the wiring L31 of the third wiring layer L3, the via electrode Vi5, and via the wiring L41 of the fourth wiring layer L4. The BGA terminal is a ball-shaped terminal composed of a conductive material such as solder.

Further, in the top side of the package substrate 22, in the vicinity of the measurement terminal TE1, the GND terminal (ground terminal) TG1 for measurement to which ground potential is supplied is provided. The GND terminal TG1 is formed in the first wiring layer L1, and is electrically connected to the BGA terminal BG1 for the grounding potential, which is provided on the bottom side of the package substrate 22 through the via electrode Vi4, the wiring L22 of the second wiring layer L2, the through-hole Th2, the wiring L32 of the third wiring layer L3, the via electrode Vi6, and via the wiring L42 of the fourth wiring layer L4.

As shown in plan view (Top View), the measurement terminal TE1 is disposed above the through-hole Th1. Similarly, the GND terminal TG1 is disposed above the through-hole Th2. The measurement terminal TE1, as described in FIG. 2, is connected to one terminal of the resistor R.

As shown in FIG. 4, the SOC package 20 includes a rectangular semiconductor chip 21 mounted on the main surface of the rectangular package substrate 22. The external terminals for a plurality of signals formed on the main surface of the semiconductor chip 21 are electrically connected to a plurality of external terminals formed on the main surface of the package substrate 22. The plurality of external terminals of the package substrate 22 are electrically connected to a plurality of BGA terminals formed on the back surface of the package substrate 22 through a plurality of internal wiring using, for example, the first wiring layer L1 to the fourth wiring layer L4. The package substrate 22 has a first side SD1, a second side SD2 facing the first side SD1, a third side SD3 between the first side SD1 and the second side SD2, and a fourth side SD4 facing the third side SD3. The first side SD1 faces the side of DRAM package 30.

The main surface of the corner area 40 of the package substrate 22, as shown in an enlarged view, the measurement terminal TE1, the resistor R and the GND terminal TG1 for measurement are provided. That is, the measurement terminal TE1, the resistor R and the GND terminal TG1 for measurement are provided in an area near the outer periphery of the package substrate 22. The area where the measurement terminal TE1, the resistor R and the GND terminal TG1 for measurement are provided shall be referred to as a measurement terminal area TRR. That is, the measurement terminal TE1, the resistor R and the GND terminal TG1 for measurement are provided on the peripheral area of the package substrate 22 at the side of the first side SD1 facing DRAM package 30. In this example, only one set, including the measurement terminal TE1, the resistor R and the GND terminal TG1 for measurement, is drawn. However, when a plurality of sets, each including the measurement terminal TE1, the resistor R and the GND terminal TG1 for measurement, are provided, the plurality of sets of them can be provided on the peripheral area of the package substrate 22 at the side of the first side SD1 facing DRAM package 30.

FIG. 5 shows an enlarged view of the measurement terminal area TRR, where the measurement terminal TE1, the resistor R and the GND terminal TG1 for measurement are provided, and the connection to the probe PRB of the measuring apparatus FIG. 5 shows the connection to the probe PRB when the probe PRB is a differential probe. One of the pair of probe PRB is connected to the probe terminal TP1, and the other of the pair of probe PRB is connected to the GND terminal TG1 for measurement. Each terminal of the pair of probe PRB will be respectively connected to the non-inverting input terminal (+) and the inverting input terminal (−) of the amplifier circuit AMP provided in the measuring apparatus TES. The inverting input terminal (−) is connected to the ground potential terminal gnd of the amplifier circuit AMP. Thus, the potential difference between the probe terminal TP1 and the GND terminal TG1 for measurement, or the potential of the signal Sig, is monitored by the amplifier circuit AMP, so that the signal Sig can be measured. The distance LL1 between the center of the measurement terminal TE1 and the center of the GND terminal TG1 for measurement is about pitch interval of the BGA terminals, preferably about 700 μm-1 mm.

By providing a measurement terminal TE1 and the GND terminal TG1 for measurement on the SOC-package 20, the expected effectiveness is shown below.

1) Signal-Quality (Quality)

The measurement terminal TE1 on the SOC package 20 is arranged as follows to prevent disturbance of the signal Sig as much as possible. This makes it particularly superior to the observation of high-speed signal Sig.

1-1) Signal integrity at the time of measurement is ensured by providing the GND terminal TG1 that is required for measuring within 1 mm from the measurement terminal TE1 (about 1 mm in pitch of the BGA terminal). For better signal-quality, the GND terminal TG1 should be a return path. Therefore, the GND terminal TG1 is preferably connected to the BGA terminal BG1 which is adjacent to the BGA terminal BS1 for signal Sig. The BGA terminal BS1 is disposed on the back surface of the package substrate 22 (bottom side). The BGA terminals BS1 and the measurement terminal TE1, and the BGA terminal BG1 and the GND terminal TG1 are connected each other via through-holes Th1 and Th2 (longest and large hole for electrically connecting in the longitudinal direction), respectively. That is, in order to minimize the path on the package substrate of the signal and return path, the through holes Th1 and Th2 are provided so as to be disposed in the vicinity of the BGA terminals BS1 and BG1, respectively.

1-2) Signal degradation due to stub structure including the measuring system is prevented by connecting the resistor R to the measurement terminal TE1. The resistor R is arranged so as not to disturb the signal to be measured Sig in the branch structure. When the resistance value of the resistor R is too high resistance, the signal Sig does not propagate. On the other hand, when the resistance value of the resistor R is too low resistance, the branch structure is seen. Therefore, the resistance value of the resistor R is preferably selected to several 10 to several 100 ohm. The oscilloscope may include a model of the measurement system to use a waveform correction function that corrects the acquired signal waveform.

Further, the signal Sig from the semiconductor chip 21 is transmitted through the wiring of the wiring layer Top (L1) or the wiring layer L2 of the package substrate 22, and appears at the BGA terminal BS1 on bottom side through the through-hole Th1. One terminal of the resistor R which is disposed on the top side of the package substrate 22 and is connected to the signal line SL of the signal Sig to be measured is provided in the vicinity of the through-hole Th1 (near the BGA terminal on the bottom side). Since the size of the resistor R is standardized to 1005 (1.0 mm*0.5 mm) or 0603 (0.6 mm*0.3 mm), the other terminal (TP1: probe terminal) of the resistor R is also determined to some extent.

Since a measurement terminal TE1 is provided on the package substrate 22 of the SOC package 20, the signal Sig can be measured without affecting the connection with an external device. Therefore, signals from connected devices, in this instance, DRAM packages 30, can also be measured.

1-3) By providing the measurement terminal TE1 in the vicinity of the outer periphery side of the package substrate 22, it is possible to allocate an area to be provided with the resistor elements R and the GND terminal TG1 for measurement. That is, in the outer periphery side of the package substrate 22, the area for the measurement terminal TE1, the resistor R and the GND terminal TG1 for measurement is easily allocated. Therefore, it is also possible to provide a plurality of sets each including the measurement terminal TE1, the resistor R and the GND terminal TG1 for measurement on the outer periphery side of the package substrate 22, so that it is possible to increase the number of signals to be measured.

2) Packaging Area/Cost (Cost)

By providing the measurement terminal TE1 on the package substrate 22 of the SOC package 20, the area ES1 shown in FIG. 2 can be reduced in comparison to the area ES of FIG. 1. That is, an extra area on the mounting board 10 is not required. This is advantageous in terms of mounting area and cost of the semiconductor system 100.

3) Developmental Period (Delivery)

By providing the measurement terminal TE1 on the package substrate 22 of the SOC package 20, the customer can shorten the development period to provide the measurement terminals on the respective mounting board 10 in the area ES1 of FIG. 2.

Embodiment 2

Figure 6:
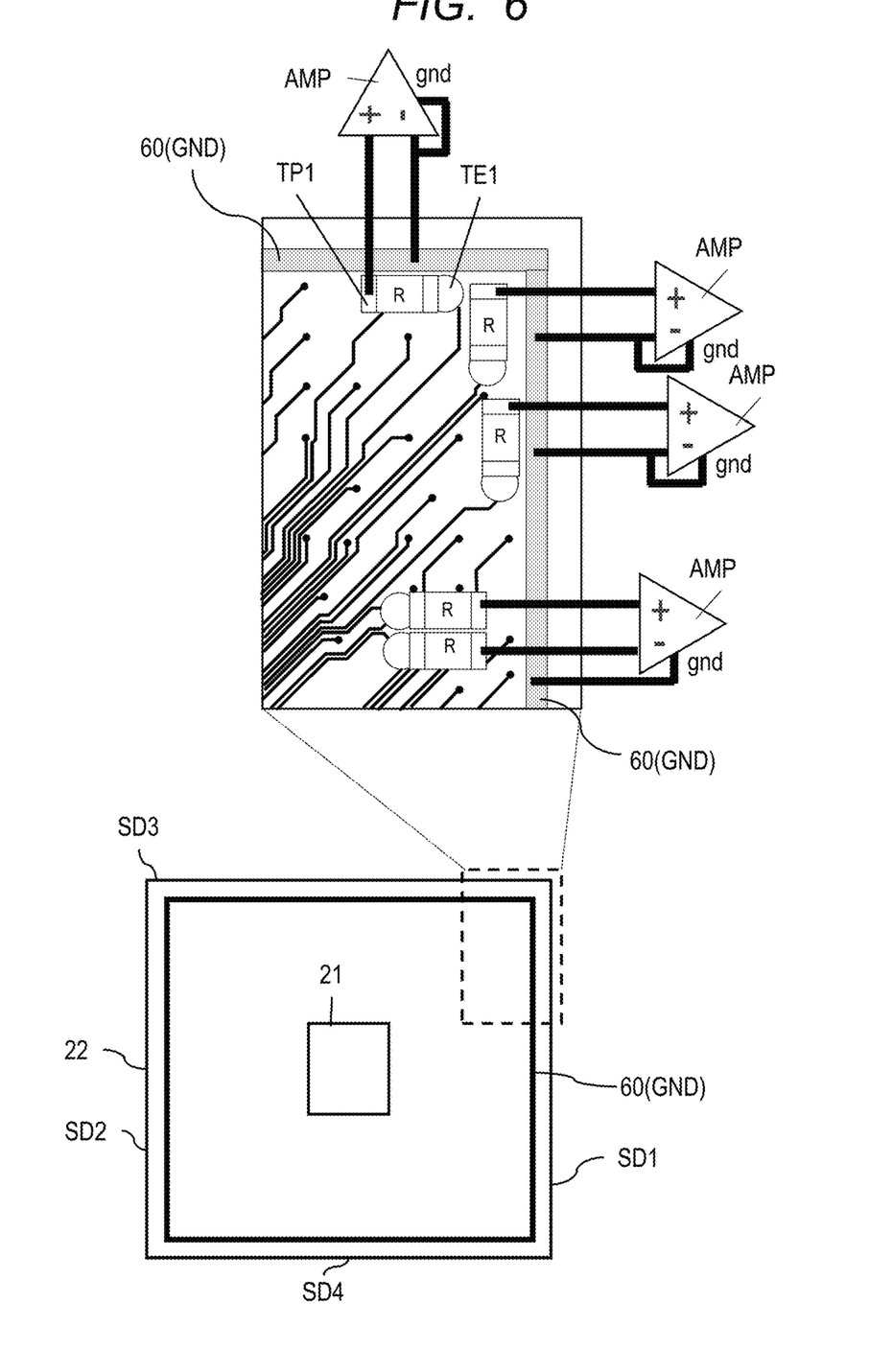
FIG. 6 is a plan view illustrating an exemplary configuration of a package substrate according to Embodiment 2.

FIG. 6 is a plan view illustrating an exemplary configuration of the package substrate 22 according to Embodiment 2. This embodiment shows an example in which the measurement terminal TE1 and the GND terminal TG1 for measurement are arranged side by side, but is not limited thereto. As shown in FIG. 6, when a plurality of the sets of the measurement terminal TE1 and the resistor R are allocated at the outer periphery side of the package substrate 22, the other of the probe PRB to be connected to the ground potential terminal gnd of the amplifier circuit AMP of the measuring apparatus may be connected to the ground region portion (GND region portion) 60 provided at the entire periphery of the outer periphery of the package substrate 22 in a ring shape. If the first wiring layer L1 of the package substrate 22 is a ground plane layer supplied with a ground potential, the GND region portion 60 can be relatively easily formed only by removing the resin layer provided on the first wiring layer L1 by etching.

According to Embodiment 2, by providing a plurality of measurement terminals TE1 on the outer periphery side of the package substrate 22, it is possible to increase the number of signals to be measured. Further, since the GND region portion 60 is provided on the entire periphery of the outer periphery of the package substrate 22, even if the number of signals to be measured (i.e., the number of measurement terminals TE1) increases, only by connecting the probe PRB connected to the ground potential terminal gnd of the amplifier circuit AMP of the measuring apparatus to the GND region portion 60, the ground potential terminal gnd can be relatively easily supplied to the ground potential.

Modified Example

The GND region portion 60, as shown in FIG. 6, is not limited to the configuration provided in a ring shape in the outer periphery side of the package substrate 22. The GND region portion 60 may be provided with a plurality of GND region portions 60 so as to be dotted in a ring shape on the entire periphery of the outer periphery of the package substrate 22, of course. The GND region portion 60 may also be provided finely arranged in a terminal shape.

The GND region portion 60, further, may be provided as several rows of GND terminal group concentrically for the signals disposed on the inner peripheral side of the BGA terminal arrangement. In this case, since the distance between the concentric annulus depends on the BGA terminal arrangement of the signal Sig, it may be an integer multiple of the pitch of the BGA terminal.

Embodiment 3

Figure 7:
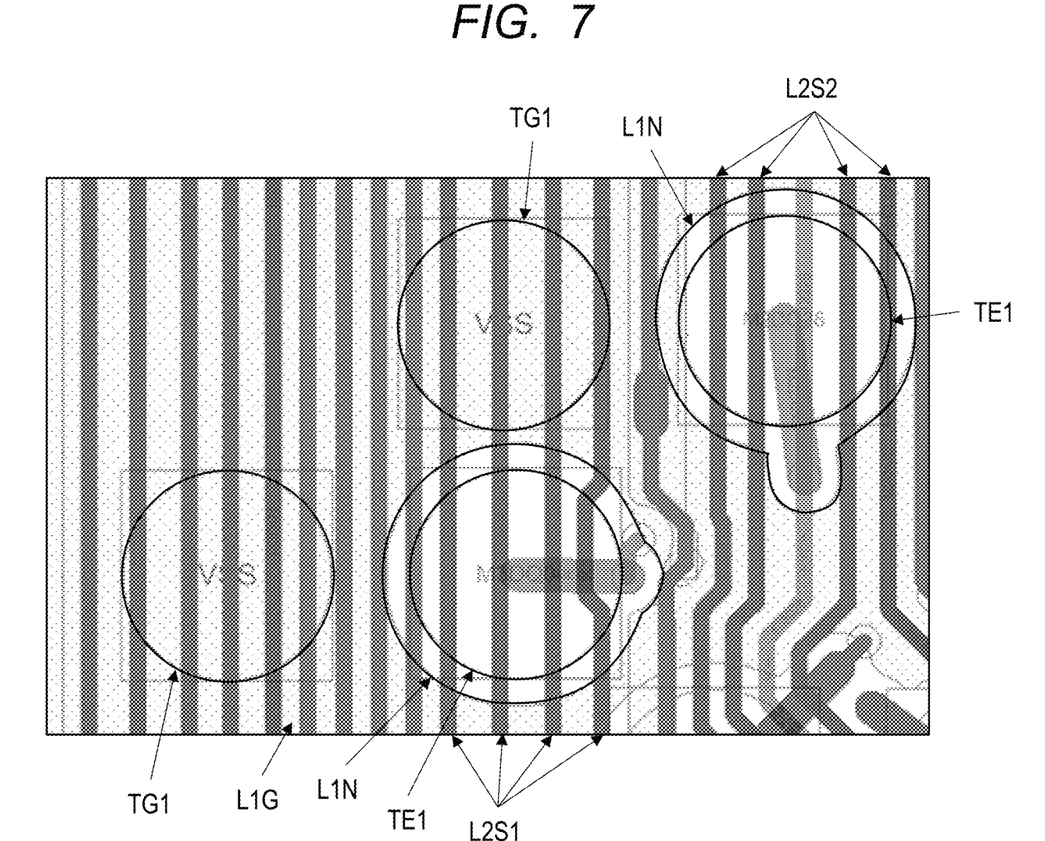
FIG. 7 is a plan view illustrating a package substrate according to comparative examples.
Figure 8:
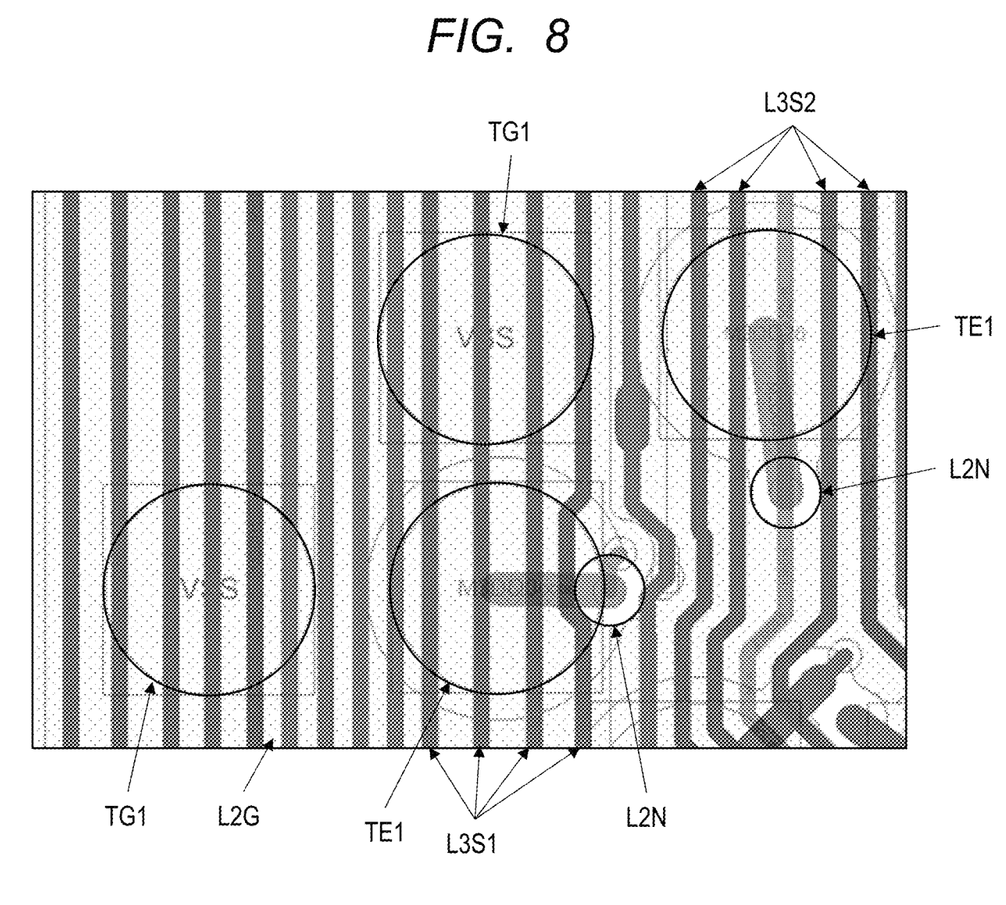
FIG. 8 is a plan view illustrating a package substrate according to Embodiment 3.

FIG. 7 is a plan view illustrating package substrate according to comparative examples. FIG. 8 is a plan view illustrating a package substrate according to Embodiment 3.

In the wiring layer configuration of the package substrate 22 of Embodiment 1 or Embodiment 2, the first wiring layer L1 as Top layer and the third wiring layer L3 are assumed to be assigned as ground plane layers of the ground potential GND (or VSS). Further, the second wiring layer L2 is assumed to be assigned as a wiring layer in which a plurality of wirings for transmitting the high-speed signals Sig are formed. At this time, as shown in FIG. 6, the wirings for the high-speed signals Sig becomes a strip line construction, both of the GND of the first wiring layer L1 and the third wiring layer L3 are the reference (i.e. return path). Since the measurement terminal TE1 is provided in the Top layer (first wiring layer L1), the top layer as the reference on the area L1N overlapping with the wirings L2S1 and L2S2 for high-speed signal Sig of the second wiring layer L2 is eliminated. Therefore, the impedance on the area L1N is higher than the other area with Strip Line structure. Thus, the signal quality of the high-speed signal Sig transmitted through a plurality of wirings L2S1 and L2S2 is reduced. That is, as shown in FIG. 7, the ground plane layers L1G of the grounding potential GND or VSS are deleted from the inner portions of the regions L1N, so that Strip Line structures cannot be formed.

In Embodiment 3, as shown in FIG. 8, the measurement terminals TE1 is formed in the Top layer (first wiring layer L1), and the second wiring layer L2 and the fourth wiring layer L4 is assigned to the ground plane layer of the ground potential GND. Furthermore, the third wiring layer L3 is assigned to the wiring layer for a plurality of wirings of high-speed signal Sig. In this way, the layer configuration of the package substrate 22 is changed. That is, on the lower layer of the measurement terminal TE1, the ground plane layer L2G constituted by the second wiring layer L2 is provided. Therefore, since the upper and lower layers of the plurality of wiring L2S1 and L2S2 for transmitting the high-speed signal Sig are ground plane layers, the Strip Line construction is formed and the signal quality of the high-speed signal Sig is improved. In FIG. 8, a portion of the ground plane layer L2G of the ground potential GND (or VSS) on the area L2N is deleted, there is no particular problem.

In this case, in order to measure the high-speed signal Sig in the vicinity of the return path, the GND terminal TG1 of the Top layer is required to connect to the ground plane layer of the second wiring layer L2 through via electrode Via (or through-hole Th) in the vicinity of the terminal.

As described in FIG. 8, if the continuity of the GND return path cannot be ensured because of the arrangement of the measurement terminal TE1, the GND layer (here, the ground plane layer of the second wiring layer L2) is added. By doing this, the return path is ensured, and the signal quality of the high-speed signal Sig is improved.

Application Examples

In FIGS. 2, 3 and 4 of Embodiment 1 and FIG. 6 of Embodiment 2, an inspection device capable of performing inspection can be configured for each system board including the mounting board 10, the SOC package 20, and DRAM package 30 by contacting a needle (probe) of the measuring apparatus on the probe terminal TP1 that is the other end of the resistor R provided on the main surface or upper surface of the package substrate 22 of the SOC package 20.

In the system fails, the DRAM package 30 is replaced in the system boards 10, 20, and 30, thereby making it possible to configure an inspection device capable of determining whether the memory device in DRAM package 30 is defective or not.

In addition, a development inspection device can be provided that can clarify the differences when the target mounting board (10) or device (SOC package 20 or DRAM package 30) is changed, such as when the mounting board is changed by deploying the customer system, when the memory vendor is changed, or when the memory process is changed. Thus, it is possible to reduce the development man-hours of the semiconductor system.

While the invention made by the present inventor has been specifically described above based on the Embodiment, the present invention is not limited to the above-described embodiment and Embodiment, and it is needless to say that the present invention can be variously modified.

What is claimed is:

1. A semiconductor apparatus comprising:
a mounting board;
a system on chip (SOC) package provided on the mounting board and including a semiconductor chip and a package substrate on which the semiconductor chip is mounted;
a memory package provided on the mounting board;
a signal wiring line through which a signal between the semiconductor chip and the memory package is transmitted, being provided on the package substrate and in the mounting board:
a measurement terminal connected to the signal wiring line on main surface of the package substrate; and
a ground terminal for measurement arranged in a vicinity of the measurement terminal on the package substrate,
wherein the measurement terminal is arranged in an outer periphery side of the package substrate.

2. The semiconductor apparatus according to claim 1, wherein a distance between the measurement terminal and the ground terminal for measurement is about 700 μm to 1 mm.

3. The semiconductor apparatus according to claim 1, wherein the package substrate further includes a resistor connected to the measurement terminal.

4. The semiconductor apparatus according to claim 1,
wherein the package substrate includes resin substrates of multilayer wiring,
wherein the multilayer wiring includes a first, a second, a third and a fourth wiring layer,
wherein the measurement terminal is formed by a wiring of the first wiring layer,
wherein the second wiring layer and the fourth wiring layer are ground plane layer supplied with a ground potential, and
wherein the third wiring layer includes a plurality of wirings for transmitting the signal output from the semiconductor chip.

5. A semiconductor apparatus comprising:
a mounting board;
a system on chip (SOC) package provided on the mounting board and including a semiconductor chip and a package substrate on which the semiconductor chip is mounted;
a memory package provided on the mounting board;
a signal wiring line through which a signal between the semiconductor chip and the memory package is transmitted, being provided on the package substrate and in the mounting board; and
a measurement terminal connected to the signal wiring line on main surface of the package substrate,
wherein the measurement terminal is arranged in an outer periphery side of the package substrate,
wherein the package substrate further includes a ground area portion arranged in a vicinity of the measurement terminal, and
wherein the ground area portion is arranged in a ring shape on the outer periphery of the package substrate.

6. The semiconductor apparatus according to claim 5, wherein the package substrate further includes a resistor connected to the measurement terminal.

7. A semiconductor device comprising:
a semiconductor chip;
a package substrate on which the semiconductor chip is mounted, including a signal wiring line supplied with a signal for the semiconductor chip;
a measurement terminal provided on a main surface of the package substrate and connected to the signal wiring line; and
a ground terminal for measurement arranged in a vicinity of the measurement terminal on the package substrate,
wherein the measurement terminal is arranged in an outer periphery side of the package substrate.

8. The semiconductor device according to claim 7, wherein a distance between the measurement terminal and the ground terminal for measurement is about 700 μm to 1 mm.

9. The semiconductor device according to claim 7, wherein the package substrate further includes a resistor connected to the measurement terminal.

10. The semiconductor device according to claim 7,
wherein the package substrate includes resin substrates of multilayer wiring,
wherein the multilayer wiring includes a first, a second, a third and a fourth wiring layer,
wherein the measurement terminal is formed by a wiring of the first wiring layer,
wherein the second wiring layer and the fourth wiring layer are ground plane layers supplied with a ground potential, and
wherein the third wiring layer includes a plurality of wirings for transmitting the signal output from the semiconductor chip.

* * * * *